United States Patent [19]

Suzuki

[11] Patent Number: 4,710,973
[45] Date of Patent: Dec. 1, 1987

[54] VARACTOR DIODE TUNER WITH BAND SWITCHED COILS AND LINES

[75] Inventor: Takeo Suzuki, Soma, Japan

[73] Assignee: Alps Electric Co., Ltd., Japan

[21] Appl. No.: 813,651

[22] Filed: Dec. 26, 1985

[30] Foreign Application Priority Data

Dec. 26, 1984 [JP] Japan .................. 59-199532[U]

[51] Int. Cl.$^4$ .................................. H03J 5/24
[52] U.S. Cl. ......................... 455/180; 455/188; 455/195; 334/15; 334/45; 334/56
[58] Field of Search .................. 334/47, 55, 56, 60, 334/14, 15, 41, 45, 1; 333/103, 104; 455/180, 188, 190, 191, 195

[56] References Cited

U.S. PATENT DOCUMENTS

| | | | |
|---|---|---|---|
| 3,400,345 | 9/1968 | Oloff | 334/47 |
| 3,526,859 | 9/1970 | Putzer | 455/191 X |
| 3,564,423 | 2/1971 | Putzer | 455/191 |
| 3,569,850 | 3/1971 | Wegner et al. | 334/15 X |
| 3,980,957 | 9/1976 | Putzer | 334/15 X |
| 4,247,953 | 1/1981 | Shingawa et al. | 455/191 |

Primary Examiner—Eugene R. LaRoche
Assistant Examiner—Benny Lee
Attorney, Agent, or Firm—Guy W. Shoup

[57] ABSTRACT

A tuner in which a band switching signal corresponding to a channel selected from a plurality of UHF and VHF bands is generated to enable the formation of a suitable resonant circuit for receiving television signals of the selected channel. It includes a varactor diode, a plurality of resonant coils and distribution constant lines which are each grounded at one end. Each of the coils and the line is provided for forming a resonant circuit for tuning one of the bands. A plurality of switching diodes are provided for connecting the other ends of the coils and the line selectively to the other end of the varactor diode. The tuner further includes a device for turning on and off the switching diodes selectively in response to the band switching signal.

7 Claims, 5 Drawing Figures

VARACTOR DIODE TUNER WITH BAND SWITCHED COILS AND LINES

BACKGROUND OF THE INVENTION

1. Field of the Invention

This invention relates to a tuner, and more particularly, to a combination tuner which is used to select the band of a desired channel from a plurality of UHF and VHF bands and a suitable circuit element for receiving television signals of the selected channel.

2. Description of the Prior Art

A reduction in size of television receivers is going on rapidly, as is evident from the appearance of a television receiver employing a liquid crystal display. This has created a strong demand for smaller television tuners. The most effective and economical way to reduce the size of a television tuner is to decrease the number of its parts. Therefore, it is usual to employ a common transistor in a high-frequency amplification circuit and a common varactor diode in a local oscillation circuit for both UHF and VHF bands, as shown by way of example in FIG. 2. The device of FIG. 2 also includes a bias circuit not shown.

In FIG. 2, TR is an amplifying transistor having a grounded base, $C_1$ to $C_3$ are capacitors, VRD is a varactor diode grounded at one end, DCL is a distribution constant line serving as a resonant line for the UHF bands, $L_1$ is a resonant coil for high VHF channels (channels 4 to 12), $L_2$ is a resonant coil for low VHF channels (channels 1 to 3), and $SW_1$ and $SW_2$ are diodes for switching the resonant band. The distribution constant line DCL and the resonant coils $L_1$ and $L_2$ are connected in series to one another. The distribution constant line DCL has one end connected to the collector of the transistor TR and the cathode of the varactor diode VRD through the capacitors $C_2$ and $C_3$, respectively. The junction between the distribution constant line DCL and the resonant coil $L_1$ is grounded through the switching diode $SW_1$. The junction between the resonant coils $L_1$ and $L_2$ is grounded through the switching diode $SW_2$. The opposite end of the coil $L_2$ from its junction with $L_1$ is also grounded.

The varactor diode VRD has a limited capacity change which is not sufficient to cover the whole range of UHF and VHF bands. Therefore, the whole range is divided into three bands, i.e., (1) UHF channels, (2) low VHF channels (channels 1 to 3), and (3) high VHF channels (channels 4 to 12), and a tuning circuit which is suitable for a desired band is formed to enable the use of the transistor TR and the varactor diode VRD in common for the UHF and VHF bands. More specifically, if the switch $SW_1$ is turned on, the varactor diode VRD and the distribution constant line DCL form a resonant circuit for tuning an UHF band, or if the switch $SW_2$ is turned on, while the switch $SW_1$ is turned off, the varactor diode VRD and the resonant coil $L_1$ form a resonant circuit for tuning a high VHF channel, or if both of the switches $SW_1$ and $SW_2$ are turned off, the varactor diode VRD and the resonant coils $L_1$ and $L_2$ form a resonant circuit for tuning a low VHF channel. A voltage corresponding to a desired channel is applied to the cathode terminal of the varactor diode VRD.

The system as hereinabove described has the advantage of enabling the selection of the three resonant circuits by the two switches. When an UHF band is selected, however, the resonant circuit, which is shown at (A) in FIG. 3, gives so large a loss that its Q-factor under no load is lowered and its characteristics are impaired to a practically unacceptable extent. This is due to the voltage and current distributions of the distribution constant line DCL which are shown at (B) and (C), respectively, in FIG. 3. The current becomes the highest at the switch $SW_1$ which is a switching diode having a high series resistance, and the resonant circuit shows the largest loss at the switch $SW_1$.

SUMMARY OF THE INVENTION

It is an object of this invention to provide a tuner in which the resonant circuits for desired bands are selectively formed to enable the use of a transistor and a varactor diode in common for the UHF and VHF bands, and which are excellent in characteristics.

It is another object of this invention to provide a tuner which enables a reduction in the loss of the resonant circuit for the UHF band.

These objects are attained by a tuner in which a band switching signal corresponding to a channel selected from a plurality of UHF and VHF bands is generated to enable the selection of a suitable circuit element for receiving television signals of the selected channel, characterized by comprising a varactor diode grounded at one end, a plurality of coils and a distribution constant line each provided for one of the bands and grounded at one end, a plurality of switching diodes provided for connecting the other ends of the coils and the distribution constant line selectively to the other end of the varactor diode, and means for turning on or off each of the switching diodes in accordance with the band switching signal.

According to this invention, the resonant circuit for the UHF band can be formed by positioning the relevant switching diode at the point of the minimum current in the distribution constant line. Therefore, it is possible to reduce the loss of the resonant circuit for the UHF band to a practically permissible extent despite the high resistance of the switching diode.

DETAILED DESCRIPTION OF THE INVENTION

Figure 1:
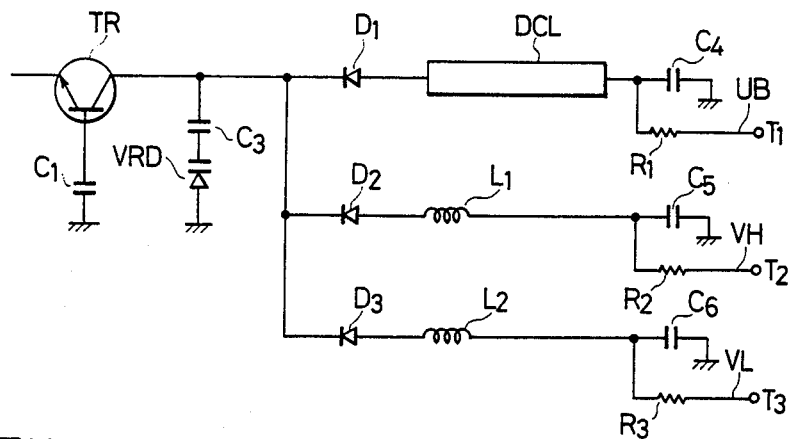
FIG. 1 is a diagram showing the high-frequency amplification circuit of a tuner embodying this invention.
Figure 2:
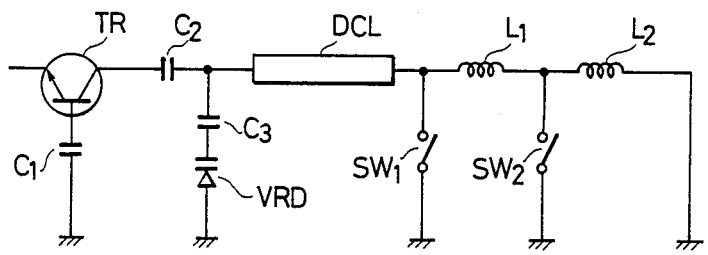
FIG. 2 is a diagram showing a conventional high-frequency amplification circuit.
Figure 3:
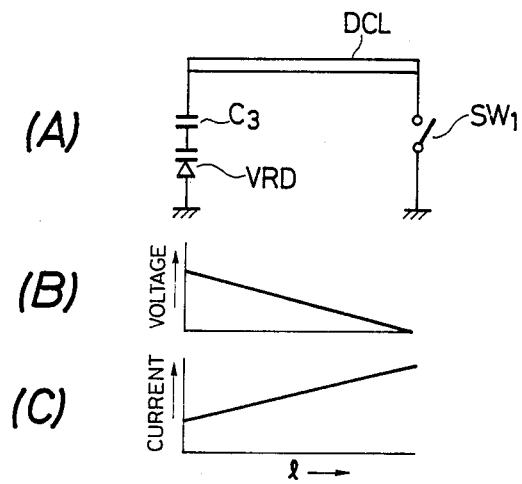
FIGS. 3(A) to 3(C) explain the drawback of the circuit shown in FIG. 2.

Referring to FIG. 1, there is shown a high-frequency amplification circuit for a tuner embodying this invention. FIG. 1 does not show a bias circuit except means for turning on or off each switching diode. In FIG. 1, TR is an amplifying transistor having a grounded base, $C_1$ and $C_3$ are capacitors, VRD is a varactor diode grounded at one end, DCL is a distribution constant line serving to form an UHF resonant line, $L_1$ is a resonant coil for a high VHF channel, $L_2$ is a resonant coil for a low VHF channel, and $D_1$ to $D_3$ are diodes for switching the resonant bands.

The distribution constant line DCL and the coils $L_1$ and $L_2$ are connected in parallel to one another. The distribution constant line DCL has one end connected through the switching diode $D_1$ to the collector terminal of the transistor TR and the cathode terminal of the varactor diode VRD, while the other end thereof is grounded through a DC cut capacitors $C_4$. Thus, the switching diode $D_1$ is located at the point of the minimum current in the distribution constant line DCL.

The resonant coil $L_1$ has one end connected through the switching diode $D_2$ to the collector of the transistor TR and the cathode of the varactor diode VRD, while the other end thereof is grounded through a DC cut capacitors $C_5$.

The resonant coil $L_2$ has one end connected through the switching diode $D_3$ to the collector of the transistor TR and the cathode terminal of the varactor diode VRD, while the other end thereof is grounded through a DC cut capacitors $C_6$. Each of the condensers $C_4$ to $C_6$ has so large a capacity, and its impedance is, therefore, so low that there is no undesirable reduction in Q-factor of the circuit.

Band switching signals UB, VH and VL (positive voltage) are applied to the junction between the distribution constant line DCL and the capacitors $C_4$, the junction between the coil $L_1$ and the capacitors $C_5$ and the junction between the coil $L_2$ and the capacitors $C_6$, respectively, from terminals $T_1$ to $T_3$ through resistances $R_1$ to $R_3$.

When the reception of television broadcasting through an UHF channel is desired, the band switching signal UB is applied to the terminal $T_1$ to forward bias the switching diode $D_1$ and turn it on, while reverse biasing the switching diodes $D_2$ and $D_3$ and turning them off. As a result, the varactor diode VRD and the distribution constant line DCL form a resonant circuit for tuning the UHF band. The signal UB also functions to bias the transistor TR when television broadcasting through the UHF channel is received.

When the reception of television broadcasting through a high VHF channel (one of channels 4 to 12) is desired, the band switching signal VH is applied to the terminal $T_2$ to turn on the switching diode $D_2$, while turning off the switching diodes $D_1$ and $D_3$, whereupon the varactor diode VRD and the resonant coil $L_1$ form a resonant circuit for tuning the selected VHF channel. The signal VH also functions to bias the transistor TR during the reception of broadcasting through any such VHF channel.

The band switching signal VL is applied to the terminal $T_3$ to turn on the switching diode $D_3$, while turning off the switching diodes $D_1$ and $D_2$, for selecting a low VHF channel (one of channels 1 to 3), whereupon the varactor diode VRD and the coil $L_2$ form a resonant circuit for tuning the selected VHF channel. The signal VL also functions to bias the transistor TR during the reception of broadcasting through any such VHF channel.

It is needless to say that a voltage corresponding to the selected channel is applied to the cathode terminal of the varactor diode VRD.

Although the invention has been described with reference to an amplifier, it is, of course, equally applicable to an oscillator, or the like.

What is claimed is:

1. In a tuner having a common transistor in a high-frequency amplification circuit an a common varactor diode in a local resonant circuit in which a band switching signal corresponding to a channel selected from a plurality of UHF and VHF bands applied to said tuner to form a suitable resonant circuit for receiving television signals of the selected channel, the improvement which comprises:
   said common varactor diode connected to ground at one end;
   a plurality of resonant coils each connnected to ground at one end;
   a distribution constant line connected to ground at one end, each of said coils and said line being provided for forming a resonant circuit with said common varactor for tuning said tuner to a respective one of said bands;
   a plurality of switching diodes, each switching diode having one end connected to the other end of a respective one of said coils and said line and each switching diode's other end connected to the other end of said common varactor diode; and
   means for turning on and off said switching diodes selectively in response to said band switching signal.

2. A tuner as set forth in claim 1, wherein said coils and said line are connected in parallel to one another.

3. A tuner as set forth in claim 2, further including a plurality of DC cutoff capacitors, said one end connected to ground of each of said coils and said line being connected to one end of a respective one of said capacitors which is connected to ground at the other end.

4. A tuner as set forth in claim 3, further including said common transistor having a grounded base, said other ends of said coils and said line being selectively electrically connectable to the collector terminal of said transistor via respective switching diodes.

5. A tuner as set forth in claim 1, wherein said line is electrically connected to said varactor diode to form a resonant circuit for tuning an UHF channel when a respective one of said switching diodes has been turned on.

6. A tuner as set forth in claim 1, wherein in one of said coils is electrically connected to said varactor diode to form a resonant circuit for tuning a low VHF channel when a respective one of said switching diodes has been turned on.

7. A tuner as set forth in claim wherein one of said coils is electrically connected to said varactor diode to form a resonant circuit for tuning a high VHF channel when a respective one of said switching diodes has been turned on.

* * * * *